(12) United States Patent  
Cox et al.

(10) Patent No.: US 9,927,877 B2
(45) Date of Patent: Mar. 27, 2018

(54) DATA MANIPULATION ON ELECTRONIC DEVICE AND REMOTE TERMINAL (71) Applicants: Christopher David Cox, Shanghai (CN); Benoit Chirouter, Guangzhou Province (CN)

(72) Inventors: Christopher David Cox, Shanghai (CN); Benoit Chirouter, Guangzhou Province (CN)

(73) Assignee: CAPE EVOLUTION LIMITED, Hongkong (HK)

( * ) Notice: Subject to any disclaimer, the term of this patent is extended or adjusted under 35 U.S.C. 154(b) by 390 days.

(21) Appl. No.: 13/923,377

(22) Filed: Jun. 21, 2013

(65) Prior Publication Data

US 2013/0342457 A1 Dec. 26, 2013

Related U.S. Application Data (60) Provisional application No. 61/662,924, filed on Jun. 22, 2012.

(51) Int. Cl.
| | |
|---|---|
| G06F 3/01 | (2006.01) |
| H05K 7/14 | (2006.01) |
| G06F 3/0488 | (2013.01) |
| G06F 3/042 | (2006.01) |

(52) U.S. Cl.
CPC .............. *G06F 3/017* (2013.01); *G06F 3/012* (2013.01); *G06F 3/042* (2013.01); *G06F 3/0488* (2013.01); *H05K 7/14* (2013.01); *G06F 2200/1637* (2013.01); *G06F 2203/04106* (2013.01)

(58) Field of Classification Search
CPC .......... G02B 2027/0178; G02B 27/017; G06F 3/017; G06F 17/2836; G06F 3/0488; G06F 3/012; G06F 3/042; G06F 2200/1637; G06F 2203/04106; G06F 1/163; H04N 5/23293; H05K 7/14
See application file for complete search history.

(56) References Cited

U.S. PATENT DOCUMENTS

| | | | |
|---|---|---|---|
| 8,184,983 B1 * | 5/2012 | Ho et al. ....................... 398/130 |
| 2008/0288240 A1 * | 11/2008 | D'Agostini ......... G06F 17/2836 704/3 |
| 2009/0128448 A1 * | 5/2009 | Riechel ................... G06F 1/163 345/8 |
| 2010/0079356 A1 * | 4/2010 | Hoellwarth .......... G02B 27/017 345/8 |

(Continued)

*Primary Examiner* — Richard Hong
(74) *Attorney, Agent, or Firm* — JCIPRNET (57) ABSTRACT

Methods and systems of manipulating data on an electronic device and a remote terminal are disclosed. The system includes at least one controller in an electronic device and a remote terminal, configured to initialize the electronic device and the remote terminal, detect a first input signal associated with a desired action, capture at least a portion of an external environment, detect a second input signal associated with the desired action, and perform the desired action on the electronic device and the remote terminal according to the first input signal and the second input signal. The system also includes at least one signal detection system in the electronic device and the remote terminal controlled by the at least one controller, at least one imaging and display system in the electronic device and the remote terminal generating an image output data in real-time.

15 Claims, 8 Drawing Sheets

(56) References Cited

U.S. PATENT DOCUMENTS

| | | | |
|---|---|---|---|
| 2012/0120103 A1* | 5/2012 | Border | G02B 27/017 345/633 |
| 2012/0302289 A1* | 11/2012 | Kang | 455/557 |
| 2013/0021373 A1* | 1/2013 | Vaught | G02B 27/017 345/633 |
| 2013/0157719 A1* | 6/2013 | Liu | G06F 3/017 455/556.1 |
| 2014/0293113 A1* | 10/2014 | Niemi | H04N 5/23293 348/333.11 |

* cited by examiner

DATA MANIPULATION ON ELECTRONIC DEVICE AND REMOTE TERMINAL

CROSS-REFERENCE TO RELATED APPLICATION

This application claims the priority benefits of U.S. provisional application Ser. No. 61/662,924, filed on Jun. 22, 2012. The entirety of the above-mentioned patent application is hereby incorporated by reference herein and made a part of this specification.

BACKGROUND

Technical Field

The invention relates generally to a method and system of data manipulation between an electronic device and a remote terminal.

Related Art

Due to advancements in imaging technologies, camera systems have been utilized to capture various activities. However, when it comes to wearable electronic devices, such as cameras worn by a participant in an activity so that the hands are free to participate in the activity, these tend to be bulky and unaesthetic. Moreover, these wearable electronic devices may cause discomfort and may be controlled by activation systems that are not intuitive or prone to false triggers. Therefore, an effective method and system of data manipulation between an electronic device and a remote terminal that is both accurate, discreet, and intuitive is highly desirable.

SUMMARY

An embodiment of the invention provides a method including the following steps. An electronic device and a remote terminal are initialized and put in a wait mode for a predetermined period of time. A first input signal associated with a desired action is detected. At least a portion of an external environment is captured. A second input signal associated with the desired action is detected. According to the first input signal and the second input signal, the desired action on the electronic device and the remote terminal is performed.

An embodiment of the invention provides a non-transitory computer readable medium having instructions stored thereon that, in response to execution by a processor, cause the processor to perform operations. The instructions include: instructions for initializing an electronic device and a remote terminal, and putting the electronic device and the remote terminal in a wait mode for a predetermined period of time; instructions for detecting a first input signal associated with a desired action; instructions for capturing at least a portion of an external environment; instructions for detecting a second input signal associated with the desired action; and instructions for performing the desired action on the electronic device and the remote terminal according to the first input signal and the second input signal.

An embodiment of the invention provides a system of manipulating and analyzing data, including at least one controller in an electronic device and a remote terminal, wherein the at least one controller is configured to initialize the electronic device and the remote terminal, putting the electronic device and the remote terminal in a wait mode for a predetermined period of time, detect a first input signal associated with a desired action, capture at least a portion of an external environment, detect a second input signal associated with the desired action, and perform the desired action on the electronic device and the remote terminal according to the first input signal and the second input signal; at least one signal detection system in the electronic device and the remote terminal controlled by the at least one controller; and at least one imaging and display system in the electronic device and the remote terminal generating an image output data in real-time.

In summary, through the methods and systems of data manipulation on the electronic device and the remote terminal, embodiments of the invention minimize unintended command activations by obtaining input signals from a combination of intuitive gestures or commands. Moreover, discreetness can be ensured by using very small movements and gestures in specific sequences and patterns to execute commands.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Some embodiments of the present application will now be described more fully hereinafter with reference to the accompanying drawings, in which some, but not all embodiments of the application are shown. Indeed, various embodiments of the application may be embodied in many different forms and should not be construed as limited to the embodiments set forth herein; rather, these embodiments are provided so that this disclosure will satisfy applicable legal requirements. Like reference numerals refer to like elements throughout.

Figure 1:
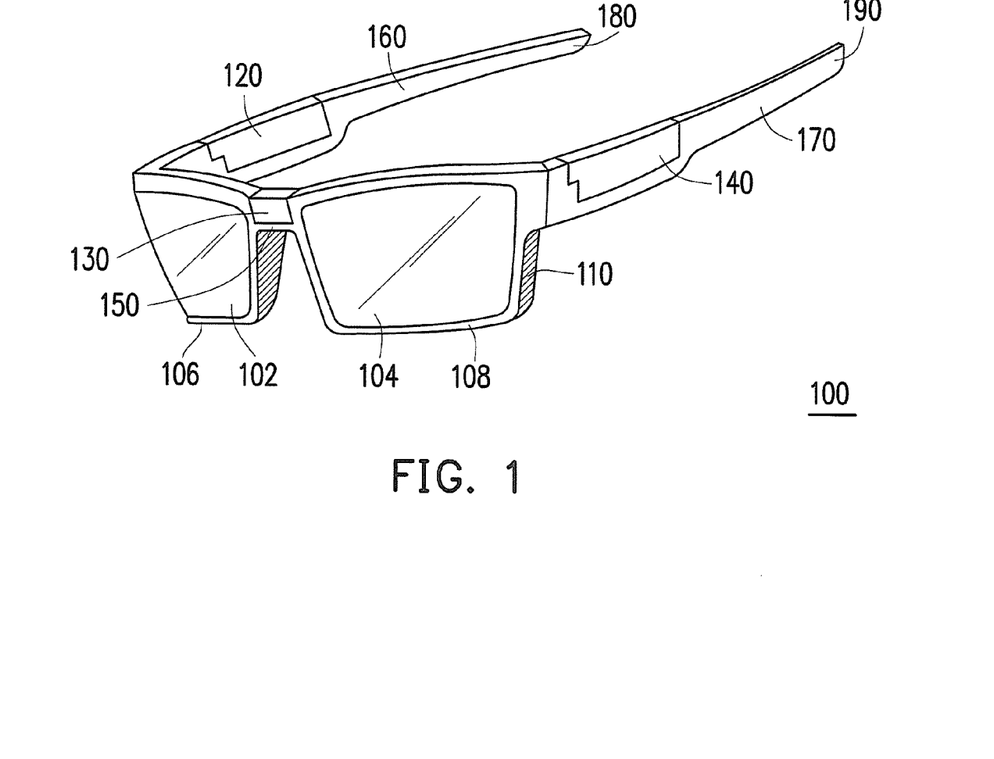
FIG. 1 is a schematic view of an electronic device according to an embodiment of the invention.

FIG. 1 is a schematic view of an electronic device according to an embodiment of the invention. With reference to FIG. 1, an electronic device 100 includes a frame 110 configured to be wearable on a user. The frame 110 includes a bridge portion 150, the lens frames 106 and 108, a first arm portion 160, a second arm portion 170, a first free end 180, and a second free end 180. The lens frames 106 and 108 may support the lens elements 102 and 104, which has at least a transparent portion and may have a portion for displaying a projected image. The first free end 180 and the second free end 180 may be worn behind the ears of a user, and the bridge portion 150 may be worn on the nose. The frame 110 and the elements contained therein may be made of plastic, metal, or a combination thereof, and at least a portion of the frame 110 may be hollowed out to allow wiring for electrical connections between components of the electronic device 100 or storage of additional components.

A plurality of capsules 120, 130, and 140 may be mounted on the frame 110 of the electronic device 100. For example, the capsule 130 enclosing an imaging unit and other components may be mounted on the bridge portion 150, the capsule 120 enclosing a controller and other components may be mounted on the first arm portion 160, and the capsule 140 enclosing a battery and other components may be mounted on the second arm portion 170. However, other possibilities exist, and other embodiments may have alternate configurations of the capsules 120, 140, and 150. One example (not drawn) may a configuration where the first arm portion 160 and the second portion 170 may be detachable and mounted to the frame 110, where the detachable arm portions may enclose components such as the controller, the battery, and other parts required according to an application. A cable connecting the first free end 180 and the second free end 180 may connect additional capsules containing auxiliary components according to another embodiment of the electronic device 100, and the cable may be worn around the head of the user, for example.

It should be noted that the capsules 120 and 140 mounted on the first arm portion 160 and the second portion 170 are configured to have substantially a same weight to maximize comfort for the user. This may be achieved by, for example, defining the volumes of the components inside the capsules 120 and 140 mounted on the frame 110, matching the dimensions of the components, comparing the weights of the components, and distributing the components to balance the weight of the capsules mounted on the frame 110. However, other methods may also be used to balance the electronic device, such as by placing dummy components in the capsules, for instance.

Figure 2:
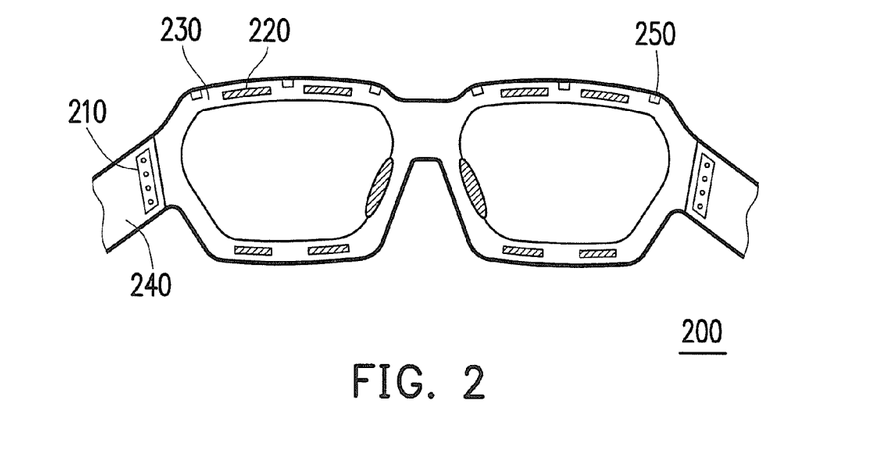
FIG. 2 depicts an display system of an electronic device according to an embodiment of the invention.

FIG. 2 depicts an display system of an electronic device according to an embodiment of the invention. In a display system of an electronic device 200 shown in FIG. 2, a plurality of light indicators 210 may be disposed on a surface of an arm portion 240 of the electronic device 200 facing the user. Moreover, a plurality of light indicators 220 may be integrated in a lens frame 230 facing the user. The light indicators 210 and 220 may be a combination of light emitting diodes (LEDs), fiber optics, or other types of light guides. Furthermore, a plurality of projection elements 250 may also be integrated in the lens frame 230 to project an image directly to the retina of the user or onto the lens elements supported by the lens frame 230, in which the lens elements may be similar to the lens elements 102 and 104 depicted in FIG. 1. The projection elements 250 may present images that allows the user to see through the displayed images on the lens elements supported by the lens frame 230, or the projection elements 250 may present opaque graphics that are overlayed on the view of the real-world environment. In addition, the projection elements 250 may be laser diodes, LEDs, fiber optics, or other types of light guides capable of projecting images directly to the retina of the user or onto the lens elements supported by the lens frame 230.

Referring to FIGS. 1 and 2, the light indicators 210 and 220 may convey information such as an operating mode of the electronic device 200 to the user through, for example, a specific combination of blinking light sequences, blinking duration, blinking patterns, and light colors, by programming the light indicators 210 and 220. The light indicators 210 and 220 may also convey information according to images or videos captured by an imaging unit, such as an imaging unit enclosed by the capsule 150 of the electronic device 100 depicted in FIG. 1. Moreover, by programming the light indicators 210 and 220, as well as the projection of images by the projection elements 250, real-time information transmitted from sensors or a communication interface in the electronic device 200 may be clearly conveyed and displayed without distracting the user from a current activity. One example would be a programmed sequence of color lights from the light indicators 210 and 220 when a signal from an external heart rate sensor is received in the electronic device 200 through the communication interface. The user may be alerted by a succession of rapid flashing light indicators 210 and 220, for example, when the external heart rate sensor senses the heart rate of the user is abnormal and sends the corresponding signal to the electronic device 200. Another programmed sequence from the light indicators 210 and 220 may alert the user according to data received by the electronic device 200 from a mobile phone, or from external sensors with a Global Positioning System (GPS). The display system of the electronic device 200 may be programmed according to data received by other external devices, such as a notebook, a tablet, a smartwatch, other wearable electronic devices, or from a scannable stationary or dynamic target. Accordingly, the user of the electronic device 200 may perceive vital information that is displayed by the display system without distraction from the current activity.

Figure 3:
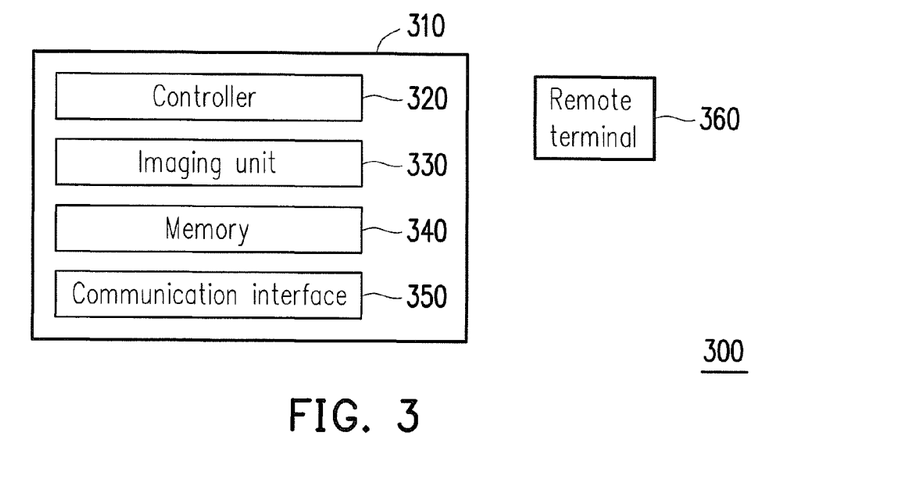
FIG. 3 illustrates a system of data manipulation on an electronic device and a remote terminal according to an embodiment of the invention.

FIG. 3 illustrates a system of data manipulation on an electronic device and a remote terminal according to an embodiment of the invention. With reference to FIG. 3, an example system 300 of the present embodiment includes a device 310 and a remote terminal 360. The device 310 may be any type of device that is capable of receiving data and executing instructions based on the data. For example, the device 310 may be the electronic device 100 shown in FIG. 1, or the electronic device 200 depicted in FIG. 2, for example. The device 310 may include a controller 320, an imaging unit 330, a memory 340, and a communication interface 350. The controller 320, the imaging unit 330, the memory 340, and the communication interface 350 may be enclosed by the capsules 120, 130, and 140 shown in the electronic device 100 of FIG. 1, for example. The remote terminal 360 may be any type of computing devices having a transceiver including a desktop computer, laptop computer, a smartphone, or tablet computing device, or any device that is configured to transmit data to the device 310, such as a heart rate sensor or an altimeter, or wearable computing devices such as a smart watch, bracelet, or ring, for example. Furthermore, the communication interface 350 of the device 310 and the remote terminal 360 may contain hardware to enable a communication link with each other, such as transmitters, receivers, antennas, etc. The controller 320 may be a processor which receives data, such as a command instruction, from the remote terminal 360 through the communication interface 350. For example, the remote terminal 360 may transmit data to the device 310 instructing the device 310 to capture an image or a video. The controller 320 would then perform operations from program codes stored in the memory 340 in order to control the imaging unit 330 (e.g. enclosed in the capsule 150 of FIG. 1) to capture the image or video. The captured image file would then be stored back in the memory 340 or transmitted back to the remote terminal 360, for example. It should be noted that, the imaging unit 330 may also contain optical and electrical elements which enable the display of the captured image or video to the user wearing the device 310 in real time, such as by projection by the projection elements 250 depicted in FIG. 2. In another embodiment, the communication interface 350 may contain notification elements such as the light indicators 210 and 220 shown in FIG. 2, which alert the user of various functions of the device 310 and is viewable by the user wearing the device 310.

It should be further noted that a wired or wireless communication link may be established between the device 310 and the remote terminal 360. For example, the communication link may be a wired serial bus such as a universal serial bus or a parallel bus. A wired connection may be a proprietary connection as well. The wireless communication link may be established by using, e.g., Bluetooth radio technology, communication protocols described in IEEE 802.11 (including any IEEE 802.11 revisions), cellular technology (such as GSM, CDMA, UMTS, EVDO, WiMAX, or LTE), or Zigbee technology, among other possibilities. The remote terminal 360 may be accessible via the Internet and may include a computing cluster associated with a particular web service (e.g., social-networking, photo sharing, address book, etc.). Furthermore, the controller 320, the imaging unit 330, the memory 340, and the communication interface 350 enclosed by the capsules may also communicate to each other by a wireless link using the aforementioned techniques.

Figure 4:
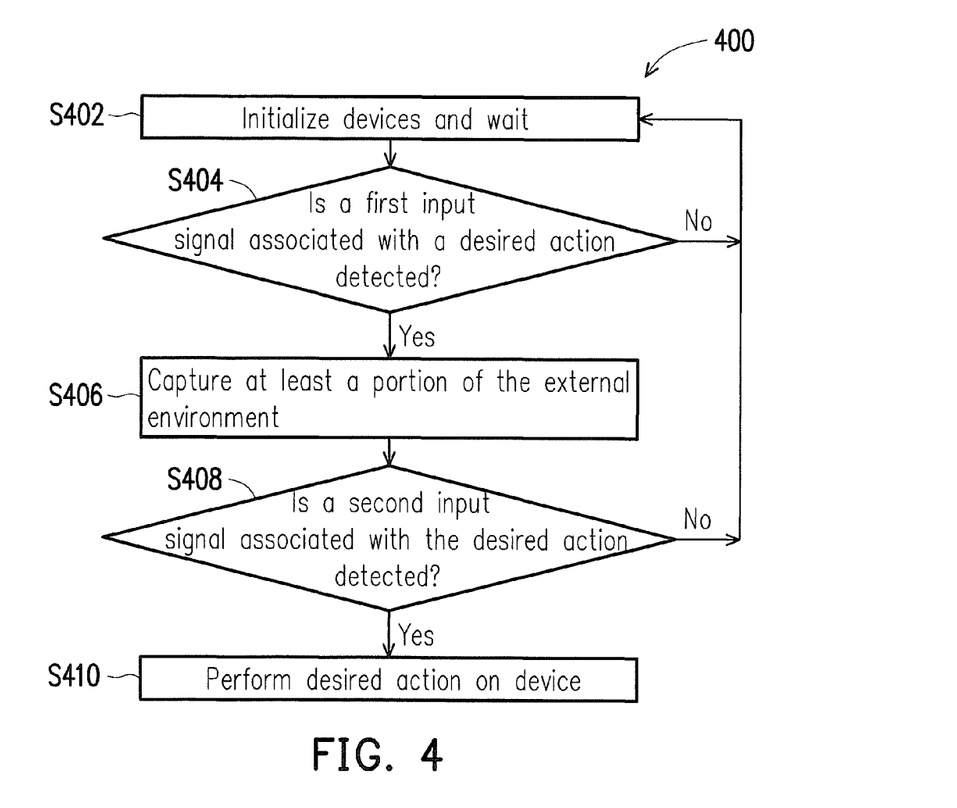
FIG. 4 is a flow diagram of a method of data manipulation on an electronic device and a remote terminal according to an embodiment of the invention.

FIG. 4 is a flow diagram of a method of data manipulation on an electronic device and a remote terminal according to an embodiment of the invention. A method 400 shown in FIG. 4 may be performed on the electronic device 310 and the remote terminal 360 depicted in FIG. 3, for example, although other possibilities exist as well. In Step S402, the electronic device and the remote terminal are initialized and put in a wait mode for a predetermined period of time. The electronic device and the remote terminal may be initialized by using the electronic device to capture an image displayed by the remote terminal, although other initialization methods are also possible, such as by speaking a voice command to one or both of the electronic device and the remote terminal when discreetness is not necessary. In Step S404, a signal detection system on the electronic device and the remote terminal may detect a first input signal associated with a desired action. The signal detection system on the electronic device may be formed by using the controller 320, a video camera and/or a laser diode array in the imaging unit 330 configured to detect hand gestures, as well as other components such as a microphone, an accelerometer, and a gyroscope in the electronic device as required by the application. For example, the laser diode array may be used to detect hand gestures or other motion.

If the first input signal is not detected by the signal detection system, the method returns to Step S402 and the devices are reinitialized and put in the wait mode. On the other hand, if the first input signal is detected, then the method proceeds to Step S406. In Step S406, the electronic device captures at least a portion of the external environment. The electronic device may capture a photo or a video using the imaging unit 330 in FIG. 3, for example, or an accelerometer and a gyroscope in the electronic device may capture a motion of the user's head wearing the electronic device, for example. Other sensors in the electronic device may also be used to capture a portion of the external environment, and the capture process is not limited to the aforementioned examples. In Step S408, the signal detection system then detects a second input signal associated with the desired action. If the second input signal is not detected by the signal detection system, the method returns to Step S402 and the devices are reinitialized and put in the wait mode. If the second input signal is detected by the signal detection system, then the desired action is performed on the electronic device and the remote terminal (Step S410). It should be noted that the desired action may be any function performable on the electronic device and the remote terminal, and the desired action may also include Internet enabled services when the electronic device and the remote terminal are connected to the Internet. It should also be appreciated that the number of input signals is not limited to being two, and more than two input signals can be detected by the signal detection system on the electronic device and the remote terminal.

Several examples of the method 400 are illustrated in the following description to further elaborate on how data manipulation is performed on the electronic device and the remote terminal.

Figure 5A:
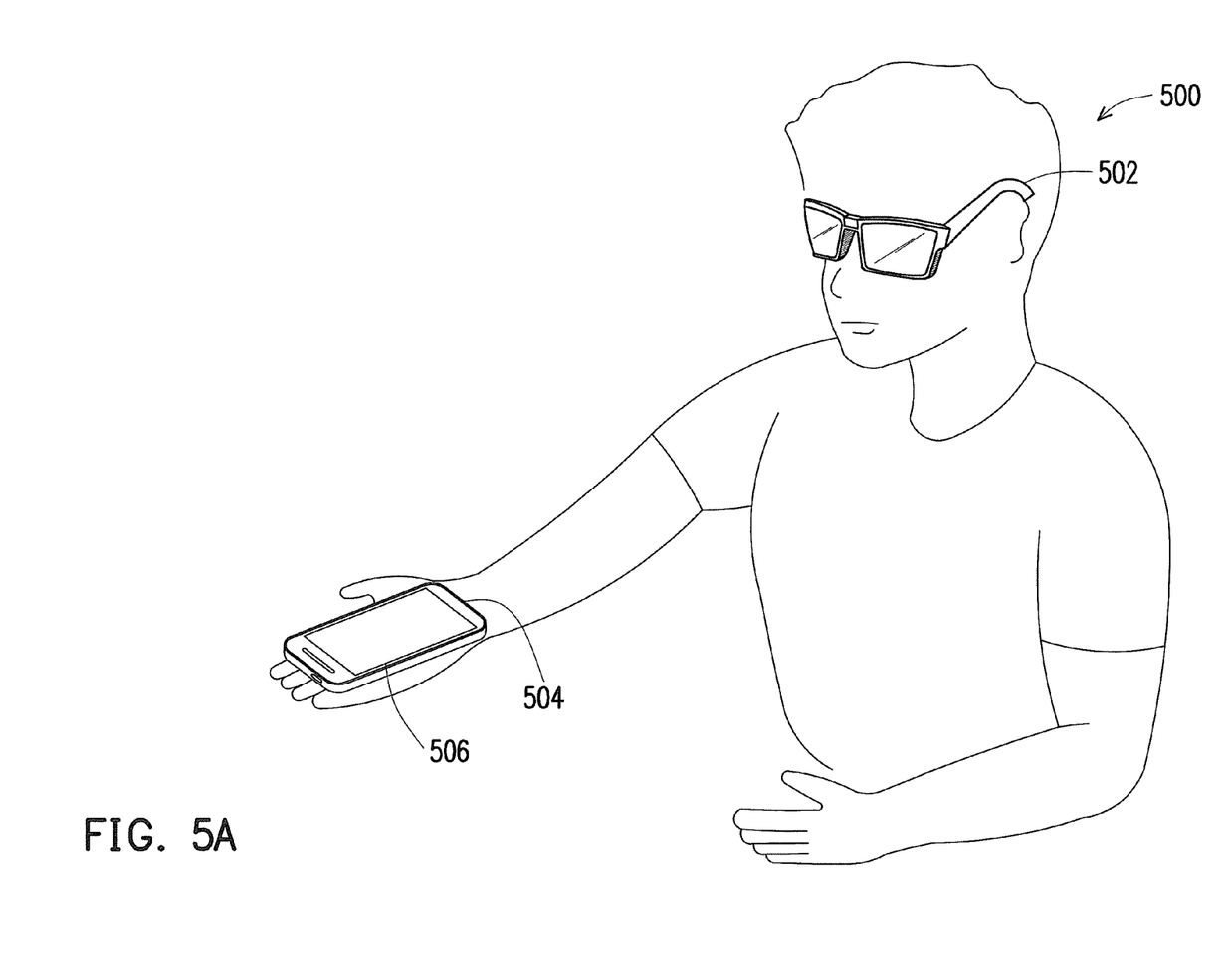
FIGS. 5A and 5B are schematic views of an example method of data manipulation on an electronic device and a remote terminal according to an embodiment of the invention.
Figure 5B:
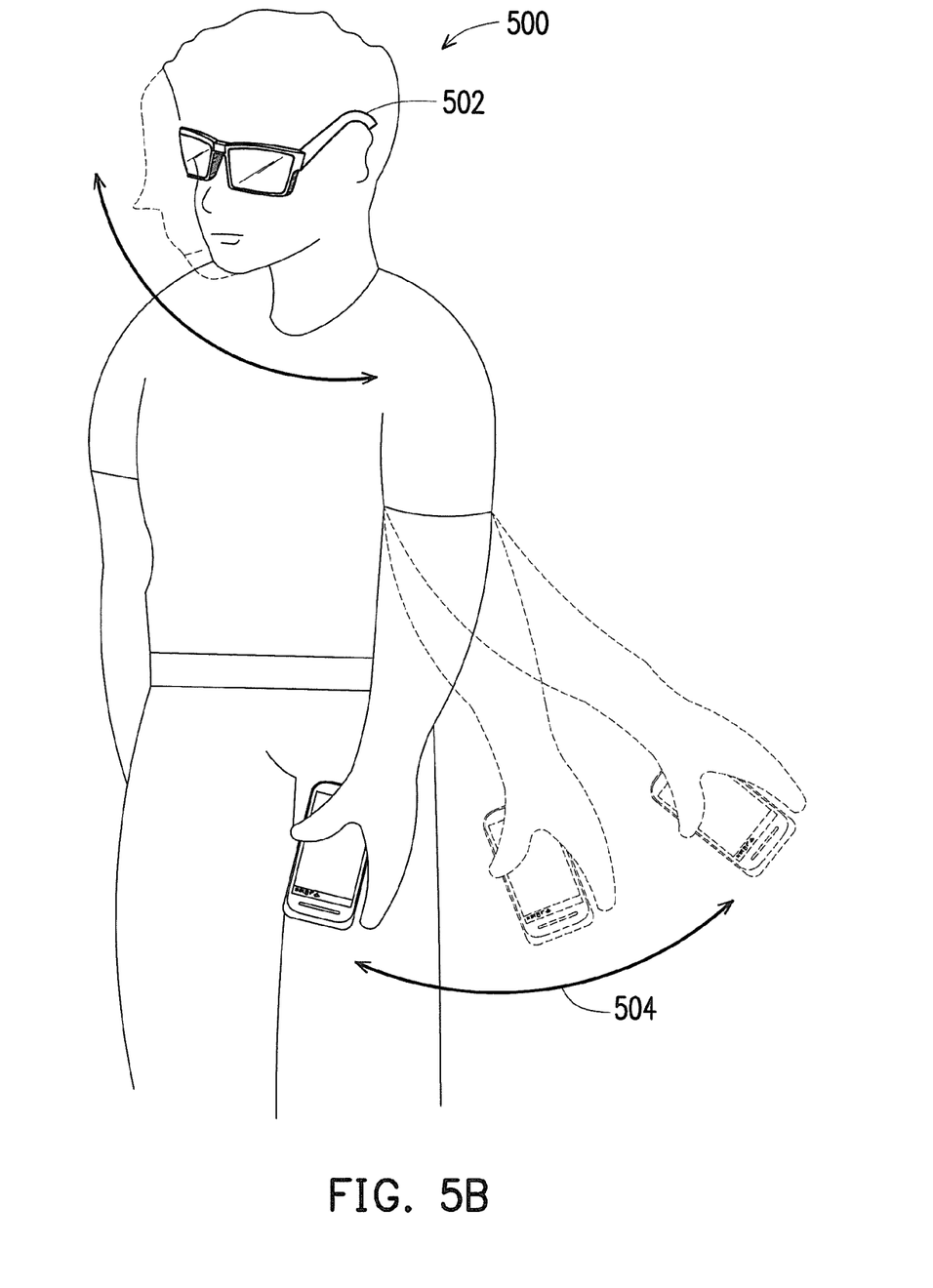

FIGS. 5A and 5B are schematic views of an example method of data manipulation on an electronic device and a remote terminal according to an embodiment of the invention. In an example method 500 shown in FIGS. 5A and 5B, the user wants to perform a desired action, which is taking a photo in this example. The user performs a combination of a swing of the remote terminal 504 and a head turn with the electronic device 502 to trigger the desired action. To begin, the electronic device 502 and the remote terminal 504 are initialized in FIG. 5A by the user looking at a display 506 on the remote terminal 504. A camera on the remote terminal 504 and the electronic device 502 may be used for the initialization. For example, the camera on the remote terminal 504 may capture an image of the user's face and use a facial recognition algorithm or a eye tracking algorithm to initialize the remote terminal 504 for the method 500, or obtain the first and second input signals. Moreover, the camera on the electronic device 502 may capture a displayed initialization graphics on the display 506, such as a Quick Response (QR) code graphics, in order to initialize the electronic device 502 for the method 500, or obtain the first and second input signals. Other types of initialization graphics are also possible, such as various types of optically machine-readable barcodes. Once the electronic device 502 and the remote terminal 504 are initialized, the user may swing the remote terminal 504 back and forth as shown in FIG. 5B. In one example, the accelerometer and the gyroscope in the signal detection system on the remote terminal 504 detect a first input signal, and the signal detection system on the electronic device 502 also detects the first input signal when a detection success message is sent to the electronic device 502. The user may then proceed to turn his head to the right or left. The electronic device 502 captures at least a portion of the external environment, and in this example, the accelerometer and gyroscope in the electronic device 502 captures the motion of the user's head. The signal detection system in the electronic device 502 detects the second input signal, and accordingly the electronic device 502 performs the desired action of taking a photo. However, if either the first or second input signal is not detected by the signal detection system, then the electronic device 502 and the remote terminal 504 are reinitialized and placed in the wait mode until both the first and the second input signals are detected by the signal detection system. It should be noted that the type and the order of the user's gestures are not limited to the ones shown FIGS. 5A and 5B. For example, the user may turn his head first and then swing the remote terminal 504. Alternatively, the user may tap the remote terminal 504 and turn his head, and other possibilities exist as well. One example would be using a hand gesture for the electronic device 502 to obtain the input signal from recognizing the hand gesture from the captured photo. The user may make a shape of a rectangle with both hands, and the controller in the electronic device 502 or the remote terminal 504 may be programmed to recognize the hand gesture, for example.

Figure 6A:
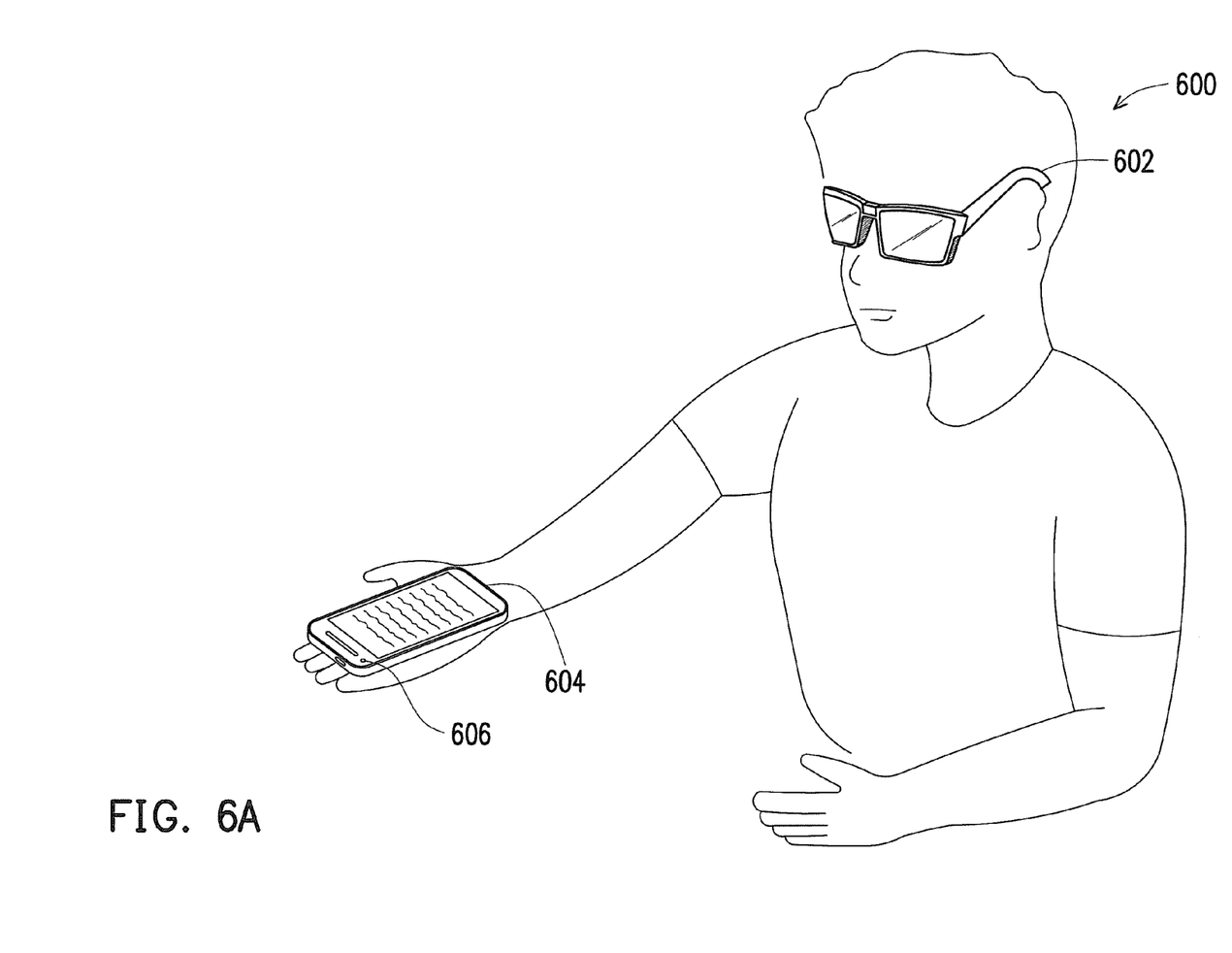
FIGS. 6A-6C are schematic views of an example method of data manipulation on an electronic device and a remote terminal according to an embodiment of the invention.
Figure 6B:
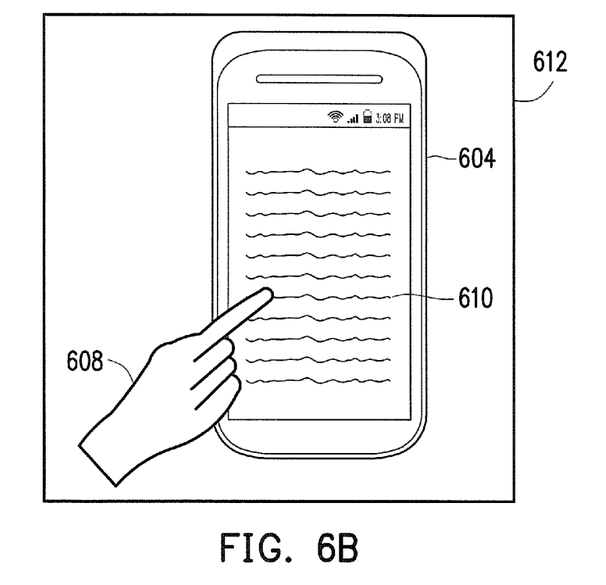
Figure 6C:
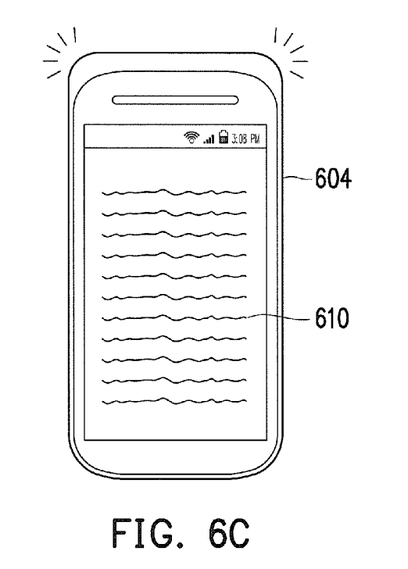

FIGS. 6A-6C are schematic views of an example method of data manipulation on an electronic device and a remote terminal according to an embodiment of the invention. In a method 600 shown in FIG. 6A, the user nods his head and points at a line of text in order to perform a desired action of translating the line of text and having the remote terminal 604 read it aloud. To start, the electronic device 602 and the remote terminal 604 may be initialized by the user looking at a light-emitting diode 606 on the remote terminal 604. The light sensor 606 may be an infrared diode or camera, for example. Once an infrared light signature is picked up by the electronic device 602 and is recognized, the electronic device 602 initializes and sends a confirmation message to the remote terminal 604 so it also becomes initialized. After initialization, the user may nod his head so the first input signal is detected by the accelerometer and the gyroscope of the signal detection system in the electronic device 602. The user then points at a line of text 610 he wishes to be translated, and the camera in the electronic device 602 captures a photo of the user's hand and the remote terminal 604 containing the line of text 610 (i.e., a portion of the external environment). The signal detection system in the electronic device 602 and/or the remote terminal 604 recognize the hand of the user in the captured photo as the second input signal. In some embodiments, the signal detection systems in the electronic device 602 and the remote terminal 604 may be calibrated in advance for recognition of the point of interest according to the locations of the sensors in the signal detection systems relative to a predetermined reference point, such as the location of the head of user wearing the electronic device 602, or other suitable reference points relative to the remote terminal. Accordingly, the electronic device 602 sends a command to the remote terminal 604 to translate the line of text 610 and read it aloud, and the desired action is then performed on the remote terminal 604 as shown in FIG. 6C.

Figure 7A:
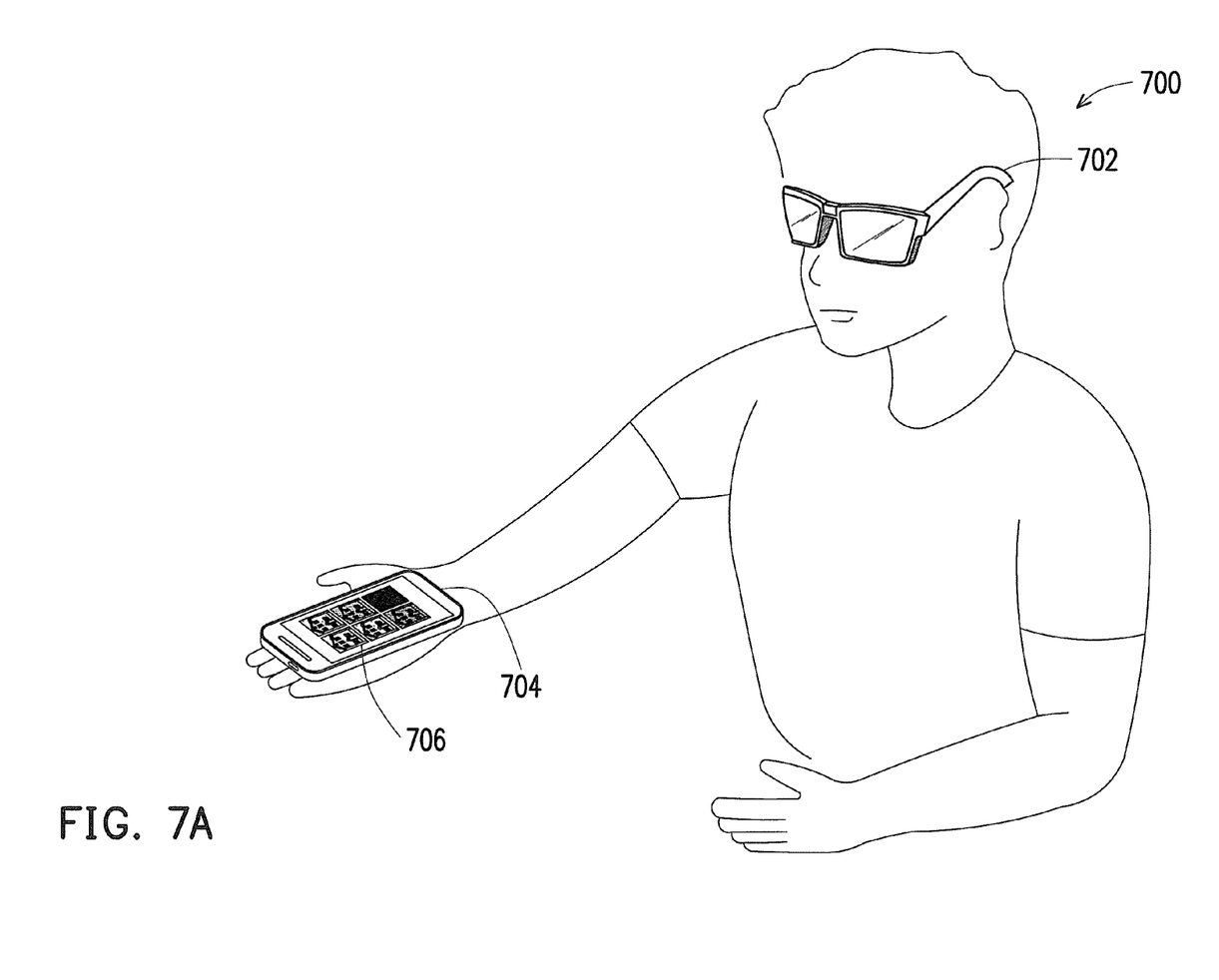
FIGS. 7A and 7B are schematic views of an example method of data manipulation on an electronic device and a remote terminal according to an embodiment of the invention.
Figure 7B:
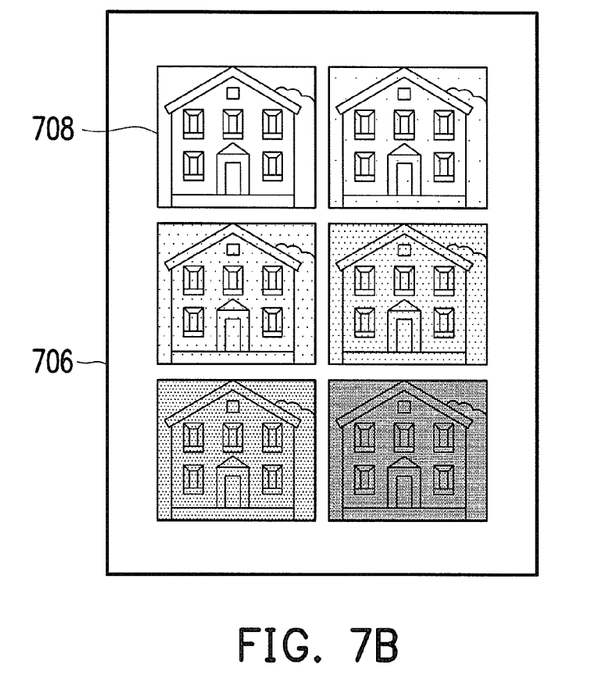

FIGS. 7A and 7B are schematic views of an example method of data manipulation on an electronic device and a remote terminal according to an embodiment of the invention. In a method 700 shown in FIG. 7A, the user wants to perform a desired action of calibrating the camera on the electronic device 702. To begin the method 700, the user may initialize the electronic device 702 and the remote terminal 704 by any of the initialization processes described earlier or by other methods. To perform the desired action, the user may take a burst of photos by a combination of gestures similar to one described in FIGS. 5A and 5B, such as by tapping the remote terminal 704 twice and then nodding his head twice. The signal detection systems in the electronic device 702 and the remote terminal 704 detect the first input signal from the combination of gestures. The electronic device 702 then takes a burst of photos with different camera settings (i.e., captures at least a portion of the external environment). Referring to FIG. 7B, the electronic device 702 then uploads the captured photos to the remote terminal 704, and the user selects the best one on the display 706 according to his visual preference, such as a photo 708 on the display 706, for example. After the user taps the preferred photo 708, the signal detection system in the remote terminal 704 detects the second input signal according to the tap selection. The remote terminal 704 then sends a calibration command to the electronic device 702 to perform the desired action of calibrating the camera on the electronic device 702 according to the camera settings that took the preferred photo 708. Accordingly, the user is able to intuitively calibrate the camera on the electronic device 702 by selecting his visual preference on the remote terminal 704, without the need for technical knowledge behind the camera settings on the electronic device 702.

Figure 8:
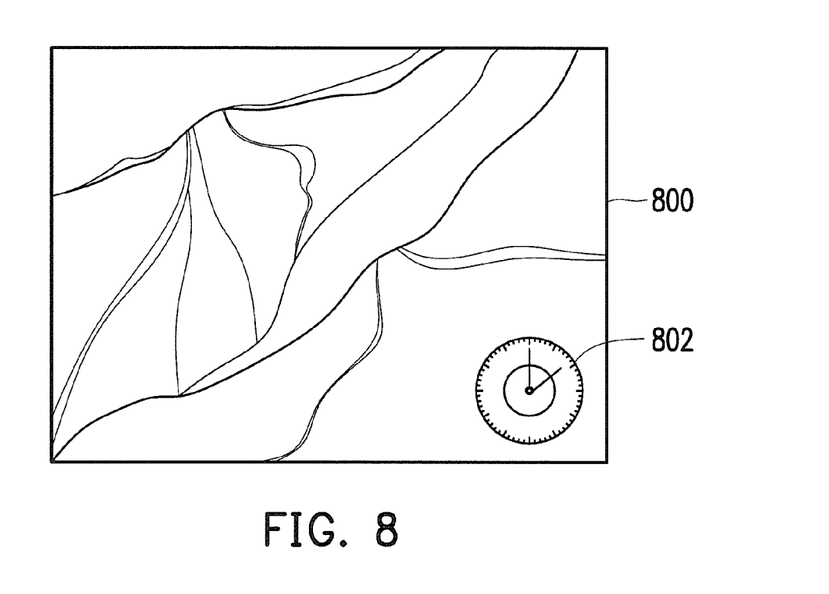
FIG. 8 is a schematic view of a real-time output of an example method of data manipulation on an electronic device and a remote terminal according to an embodiment of the invention.

FIG. 8 is a schematic view of a real-time output of an example method of data manipulation on an electronic device and a remote terminal according to an embodiment of the invention. Referring to FIG. 8, an image output 800 recorded by the electronic device or the remote terminal may have a real-time information indicator 802 embedded in the image output 800. In this example, the user may be using an external altitude recording device mounted on a bicycle, and the user may be wearing an electronic device such as the electronic device 100 or the electronic device 200 in FIGS. 1 and 2. Using a combination of triggers similar to ones described earlier, such as a turn of the user's head along with a vibration sensing (e.g., to detect when the user starts pedalling), a start command can be sent to the electronic device to start recording a video file when a bicycle race begins. During recording, the real-time information indicator 802 may include and display information uploaded from the external altitude recording device, and the display of such information may be embedded in an output file. However, other embodiments of the invention may also be configured to directly display the video file embedded with the real-time information indicator 802. For example, the display system of the electronic device such as one depicted in FIG. 2 may show the image frame of FIG. 8 embedded with the real-time information indicator 802 to the user wearing the electronic device. Moreover, the data from the real-time information indicator 802 and the recorded video file may be streamed as a combined data stream or as separate data streams to the Internet by the communication interface in the electronic device or the remote terminal discussed earlier. The electronic device may end the recording session by another combination of triggers such as by another turn of the user's head and sensing the vibration level of the bicycle. However, the invention is not limited by the examples described, and other applications and trigger combinations may be used. For example, the real-time information indicator 802 may display information transmitted from a barometer, GPS, thermometer, heart rate sensor, speedometer, other suitable sensors, or a combination of such devices used in different activities. Other possibilities exist for the combination of triggers as well, and the interaction between the electronic device and the remote terminal as well as the data obtained can be programmed in an application program interface (API).

In view of the foregoing, through the methods and systems of data manipulation on the electronic device and the remote terminal, embodiments of the invention minimize unintended command activations by obtaining input signals from a combination of intuitive gestures or commands. Moreover, discreetness can be ensured by using very small movements and gestures in specific sequences and patterns to execute commands.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method, adapted to an electronic device and a remote terminal having an established communication link, comprising:
   initializing the electronic device and the remote terminal as to detect a first input signal generated on the electronic device and a second input signal generated on the remote terminal by processing an image captured by the electronic device or the remote terminal, and putting the electronic device and the remote terminal in a wait mode for a predetermined period of time, wherein the first and second input signals are associated with a desired action;
   detecting, by the electronic device, a motion of the electronic device and generating the first input signal representing the motion of the electronic device;
   capturing at least a portion of an external environment;
   detecting, by the remote terminal, an operation being performed on the remote terminal and generating the second input signal representing the operation by using the captured external environment; and
   performing the desired action of the electronic device and the remote terminal in response to a proper combination of the first and second input signals respectively generated by different devices.

2. The method of claim 1, wherein the operation being performed on the remote terminal is a movement of the remote terminal.

3. The method of claim 1, wherein the operation being performed on the remote terminal is a touch operation sensed by the remote terminal.

4. The method of claim 1, wherein the initialization of the electronic device and the remote terminal for detecting the first and second input signals as to perform the desire action is initialized based on a facial recognition on the image captured by the remote terminal.

5. The method of claim 1, wherein the first input signal or the second input signal is obtained from a voice command from the user.

6. The method of claim 1, wherein the initialization of the electronic device and the remote terminal for detecting the first and second input signals as to perform the desire action is initialized based on a quick response (QR) code captured by the electronic device.

7. The method of claim 1, wherein performing the desired action on the electronic device and the remote terminal according to the first input signal and the second input signal comprises generating and embedding an information indicator in an image output data in real-time.

8. The method of claim 1, wherein if the first input signal or the second input signal is not detected, the electronic device and the remote terminal are reinitialized and put in the wait mode.

9. The method of claim 1, wherein the proper combination of the first and second input signals triggers the desired action of capturing an image through a camera in the electronic device.

10. The method of claim 1, wherein the captured external environment is a photo of an object pointing a line of text displayed on the remote terminal, and the captured external environment is further analyzed to determine the line of text pointed by the object as the second input signal, wherein the proper combination of the first and second input signals triggers the desired action of translating and reading the line of text pointed by the object.

11. The method of claim 1, further comprising:
   taking, by the electronic device, a burst of photos with different camera settings and transmitting the photos to the remote terminal in response to the first input signal;
   displaying, by the remote terminal, the photos on a display; and
   detecting, by the remote terminal, a tap operation performed on the display as the second input signal; and
   transmitting a calibration command to the remote terminal to perform the desired action of calibrating the camera on the electronic device according to the camera setting corresponding to one of the photos selected by the tap operation.

12. The method of claim 1, wherein the desired action does not include an action of establishing data communication link between the electronic device and remote terminal.

13. A non-transitory computer readable medium having instructions stored thereon that, in response to execution by a processor, cause the processor to perform operations, the instructions comprising:
   instructions for initializing an electronic device and a remote terminal having a data communication link established therebetween as to detect a first input signal generated on the electronic device and a second input signal generated on the remote terminal by processing an image captured by the electronic device or the remote terminal, and putting the electronic device and the remote terminal in a wait mode for a predetermined period of time, wherein the first and second input signals are associated with a desired action;
   instructions for detecting a motion of the electronic device and generating the first input signal representing the motion of the electronic device;
   instructions for capturing at least a portion of an external environment;
   instructions for detecting an operation being performed on the remote terminal and generating the second input signal representing the operation by using the captured external environment; and
   instructions for performing the desired action of the electronic device and the remote terminal in response to a proper combination of the first and second input signals respectively generated by different devices.

14. A system of manipulating data, comprising:
   at least one controller in an electronic device and a remote terminal having a data communication line established therebetween, wherein the at least one controller is configured to initialize the electronic device and the remote terminal as to detect a first input signal generated on the electronic device and a second input signal generated on the remote terminal by processing an image captured by the electronic device or the remote terminal, putting the electronic device and the remote terminal in a wait mode for a predetermined period of time, wherein the at least one controller generates a first input signal associated with a desired action by detecting a motion of the electronic device, and captures at least a portion of an external environment, wherein the at least one controller generates a second input signal associated with the desired action by detecting an operation being performed on the remote terminal using the captured external environment, and wherein the at least one controller in the electronic device or the remote terminal performs the desired action on the electronic device and the remote terminal in response to a proper combination of the first input signal and the second input signal respectively generated by different devices;

and at least one imaging and display system in the electronic device and the remote terminal generating an image output data in real-time.

15. The system of claim 14, wherein the at least one imaging and display system displays an embedded information indicator in the image output data in real-time.

* * * * *